United States Patent
Yoshimura

(10) Patent No.: US 8,586,876 B2
(45) Date of Patent: Nov. 19, 2013

(54) LAMINATED CIRCUIT BOARD AND BOARD PRODUCING METHOD

(75) Inventor: Hideaki Yoshimura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 330 days.

(21) Appl. No.: 13/085,804

(22) Filed: Apr. 13, 2011

(65) Prior Publication Data

US 2011/0303454 A1 Dec. 15, 2011

(30) Foreign Application Priority Data

Jun. 9, 2010 (JP) ................................ 2010-132395

(51) Int. Cl.
*H05K 1/11* (2006.01)
(52) U.S. Cl.
USPC ........... 174/264; 174/262; 174/263; 174/265; 174/266
(58) Field of Classification Search
USPC .......... 174/264, 262, 265, 266, 263, 250–260
See application file for complete search history.

(56) References Cited

U.S. PATENT DOCUMENTS

| | | | |
|---|---|---|---|
| 5,558,928 A * | 9/1996 | DiStefano et al. | 428/209 |
| 6,407,341 B1 * | 6/2002 | Anstrom et al. | 174/255 |
| 6,700,072 B2 * | 3/2004 | Distefano et al. | 174/256 |
| 8,063,315 B2 * | 11/2011 | Das et al. | 174/262 |
| 2004/0108131 A1 * | 6/2004 | Achari et al. | 174/255 |
| 2005/0077083 A1 * | 4/2005 | Mattix | 174/265 |
| 2005/0155792 A1 * | 7/2005 | Ito et al. | 174/264 |
| 2007/0289706 A1 | 12/2007 | Nakagawa et al. | |
| 2008/0099121 A1 * | 5/2008 | Oka et al. | 156/48 |
| 2008/0110016 A1 | 5/2008 | Card et al. | |

FOREIGN PATENT DOCUMENTS

| | | |
|---|---|---|
| CN | 1722940 A | 1/2006 |
| CN | 101031981 A | 9/2007 |
| CN | 101090610 A | 12/2007 |
| JP | 63-114239 | 5/1988 |
| JP | 04154190 | 5/1992 |
| JP | 2002-290032 | 10/2002 |
| JP | 2008-251625 | 10/2008 |

OTHER PUBLICATIONS

CN Office Action for CN Application No. 2001110078929.2, dated Apr. 2, 2013.
2nd Notification of Office Action dated Jul. 30, 2013 corresponding to Chinese Patent Application No. 201110078929.2 and English translation thereof.

* cited by examiner

*Primary Examiner* — Hoa C Nguyen
*Assistant Examiner* — Christopher L Augustin
(74) *Attorney, Agent, or Firm* — Squire Sanders (US) LLP

(57) ABSTRACT

A laminated circuit board includes a first wiring board that has a first land formed on a surface thereof; a second wiring board that has a second land formed on a surface thereof; a bonding layer that is made of a bonding resin, being laid between the first wiring board and the second wiring board, wherein the bonding layer electrically connects the first land and the second land via a conducting material; and a plate that has a through-hole into which the conducting material is supplied, wherein the plate has a resin accommodating space that accommodates therein an excess bonding resin that appears during layer stacking.

13 Claims, 5 Drawing Sheets

LAMINATED CIRCUIT BOARD AND BOARD PRODUCING METHOD

CROSS-REFERENCE TO RELATED APPLICATION

This application is based upon and claims the benefit of priority of the prior Japanese Patent Application No. 2010-132395, filed on Jun. 9, 2010, the entire contents of which are incorporated herein by reference.

FIELD

The embodiments discussed herein are directed to a laminated circuit board and a board producing method.

BACKGROUND

Well-known build-up processes for producing a multi-layered printed circuit board include an additive process and a semi-additive process in which a conductor pattern is formed on an insulating plate. The above board producing methods use, as the number of layers increases, in order to decrease the processing steps and prevent a noticeable decrease in the yield ratio, a laminating technique of bonding separately produced board layers together with a conducting material or the like in one process.

More particularly, a conducting material that is a melted metal is supplied into through-holes formed on a bonding layer and then heat and pressure are applied to a plurality of boards and thus the layers are stacked up. During the process, the bonding sheet is softened due to an increased temperature and the viscosity decreases. By the layer-stacking pressure, the material of the bonding sheet may be moved and the moved material may push the conducting material away.

A well-known technique that solves the above problem involves adjusting, depending on residual copper ratios of wiring patterns and lands formed on the surface of the board, the volume of a bonding resin to a requisite minimum, thereby suppressing an amount of the material of the bonding sheet moved by the layer-stacking pressure and, eventually, preventing the moved material from pushing the conducting material away. More particularly, various bonding sheets having different thicknesses are designed depending on the boards having different residual copper ratios and thus the thickness of the bonding resin is adjusted.

Patent Document 1: Japanese Laid-open Patent Publication No. 2002-290032

However, since the above technique of adjusting the amount of the bonding resin depending on the wiring patterns and the lands formed on the surface of the board needs various bonding sheets depending on the boards having different residual copper ratios, the technique needs complicated board producing steps.

SUMMARY

According to an aspect of an embodiment of the invention, a laminated circuit board includes a first wiring board that has a first land formed on a surface thereof; a second wiring board that has a second land formed on a surface thereof; a bonding layer that is made of a bonding resin, being laid between the first wiring board and the second wiring board, wherein the bonding layer electrically connects the first land and the second land via a conducting material; and a plate that has a through-hole into which the conducting material is supplied, wherein the plate has a resin accommodating space that accommodates therein an excess bonding resin that appears during layer stacking.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings. In order to achieve the object, the technology disclosed herein can be used in various devices, such as large scale integrations (LSIs), interposers, mother boards, various semiconductor devices, various package boards, various relay devices, and various circuit boards.

[a] First Embodiment

In the following, the configuration of the laminated circuit board according to the first embodiment, then the layer stacking method for producing the laminated circuit board, and finally the effects of the first embodiment are described.

Configuration of the Laminated Circuit Board

Figure 1:
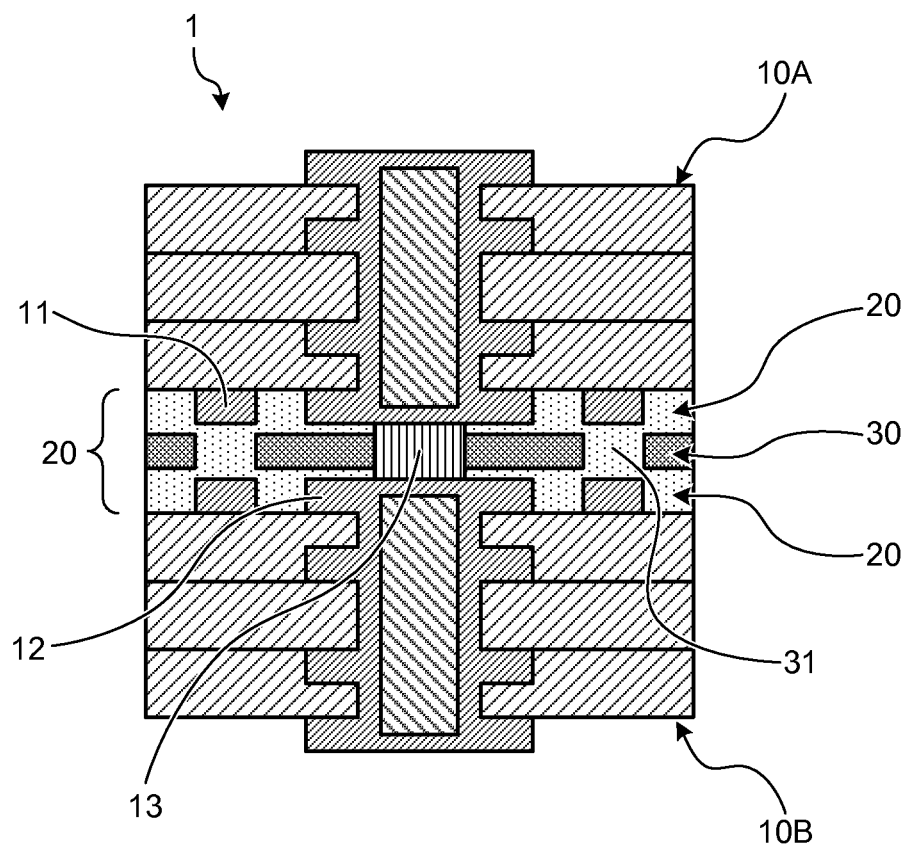
FIG. 1 is a block diagram of the configuration of a laminated circuit board 1 according to the first embodiment.

The configuration of a laminated circuit board 1 is described below with reference to FIG. 1. FIG. 1 is a block diagram of the configuration of the laminated circuit board 1 according to the first embodiment. As illustrated in FIG. 1, the laminated circuit board 1 includes a board 10A, a board 10B, wiring patterns 11, joint lands 12, a conducting material 13, a bonding layer 20, plates 30, and adjusting through-holes 31.

The laminated circuit board 1 is a multi-layered printed wiring board in which the joint lands 12 of the board 10A and the board 10B are connected to each other via the conducting material 13 and the two or more wiring patterns 11 are electrically connected to each other. The laminated circuit board 1 further includes the plate 30 between the board 10A and the board 10B, the plate 30 having the adjusting through-holes 31 to accommodate a bonding resin and a through-hole 32 into which the conducting material 13 is supplied.

The board 10A has the wiring patterns 11 printed thereon and the joint lands 12 formed on the surface thereof. Moreover, the joint lands 12 of the board 10A are connected to the respective joint lands 12 of the board 10B via the conducting material 13 and the wiring patterns 11 are electrically connected to each other. The wiring patterns 11 are copper wires.

The joint lands 12 can be covered with a noble metal, such as gold, a barrier metal, such as nickel, or a composition of any of these metals.

The board 10B also has the wiring patterns 11 printed thereon and the joint lands 12 formed on the surface thereof. The joint lands 12 thereof are connected to the respective joint lands 12 of the board 10A via the conducting material 13 and the wiring patterns 11 are electrically connected to each other.

The bonding layer 20 is laid between the board 10A and the board 10B and electrically connects the joint lands 12 of the board 10A and the joint lands 12 of the board 10B via the conducting material 13. More particularly, the bonding layer 20 is laid on bonding surfaces of the two boards 10A and 10B on which the bonding resin is stacked in such a manner that the bonding layer 20 covers the joint lands 12 and the wiring patterns 11. The resin of the bonding layer 20 is, for example, a thermosetting resin, such as a typical epoxy material, and a thermoplastic resin, such as a polyetheretherketone-based resin.

The plate 30 has the adjusting through-holes 31 that are spaces to accommodate an excess resin that appears during layer stacking and the through-hole 32 that is at a position where the conducting material 13 is formed. Moreover, the material of the plate 30 is, for example, a base material of a typical printed board. For example, the base material is made by etching a copper foil of a copper-covered plate. The adjusting through-holes 31 are formed on the base material by a drill and a router so that the volume of the adjusting through-holes 31 is equal to that of the excess part of the bonding resin calculated using the volumes of the wiring patterns 11 and the joint lands 12 and thus the plate 30 is produced.

The adjusting through-holes 31 are holes to accommodate resin and the total volume of the adjusting through-holes 31 is equal to a volume calculated using the residual copper ratios of wiring surfaces of the boards to be connected. More particularly, the adjusting through-holes 31 are holes to accommodate, when heat and pressure are applied to the two boards 10A and 10B for layer stacking, the bonding resin of the bonding sheet moved by the layer-stacking pressure. It is noted that because the spaces to accommodate the resin are through-holes, the spaces can be formed in one process in accordance with the wiring on stacking surfaces of the both boards 10A and 10B, which simplifies the processing steps as compared with the steps for separately processing the surfaces.

The plate 30 that has the two or more adjusting through-holes 31 is inserted into a layer of the laminated circuit board 1 via which the joint lands 12 are electrically connected. The total volume of the two or more adjusting through-holes 31 is equal to a volume that is calculated using the through-hole 32 filled with the conducting material 13 and the residual copper ratios of the wiring surfaces of the boards to be connected.

Because, as described above in the laminated circuit board 1, the excess bonding resin is accommodated in the adjusting through-holes 31, the bonding resin may not move out, which prevents the moved bonding resin from pushing away the conducting material 13 that connects the joint lands 12 of the boards 10A and 10B.

Moreover, the volume of the adjusting through-holes 31 that accommodate the excess bonding resin are adjusted to a value depending on the residual copper ratios of the surfaces of the stacked boards 10A and 10B on the area basis, which prevents occurrence of the phenomenon that the moving speed of the bonding material increases and decreases the area-based amount of the moved bonding resin and the area-based resin moving speed to the lowest.

Method of Producing the Laminated Circuit Board

Figure 2:
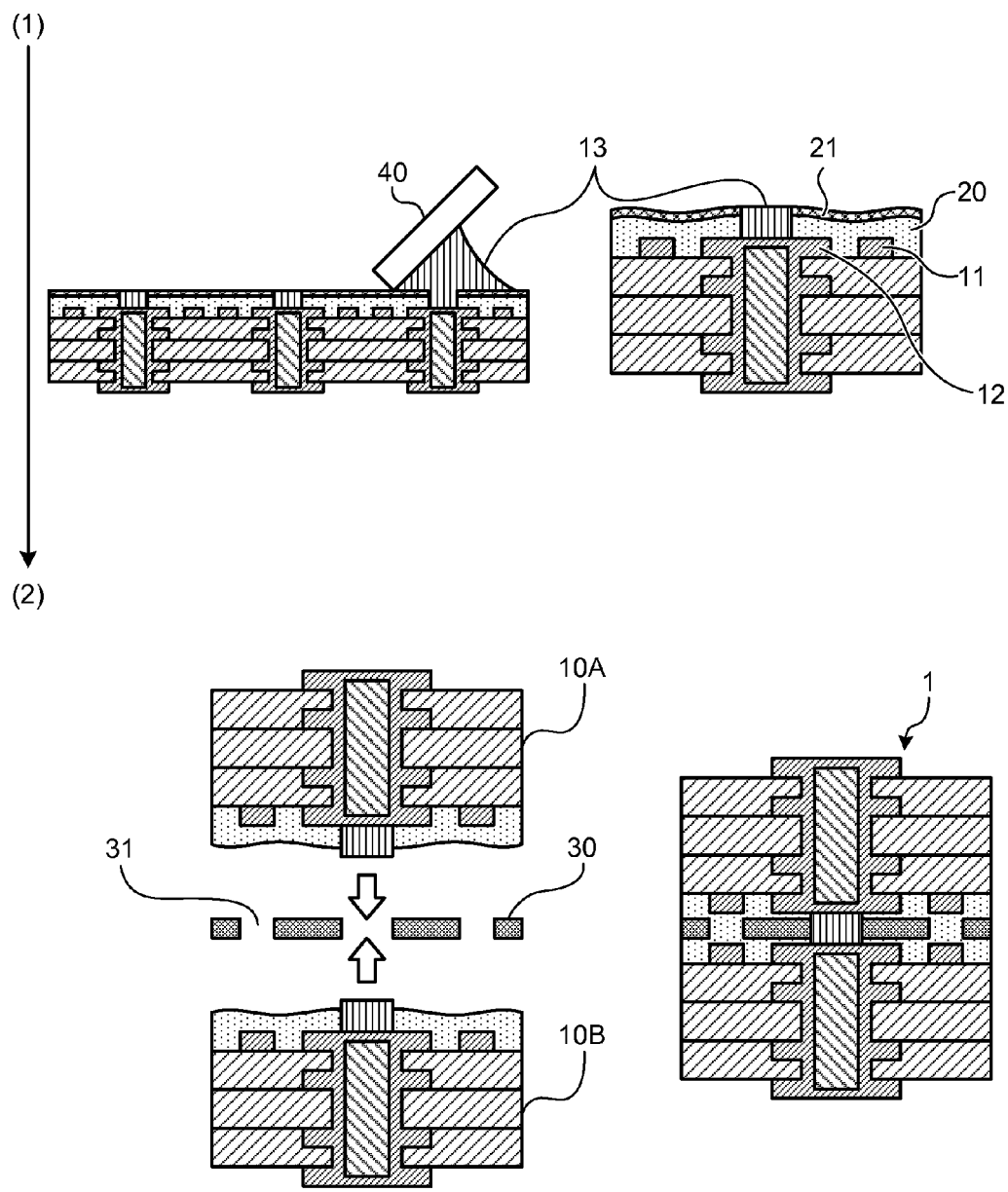
FIG. 2 is a schematic diagram that illustrates a method of stacking layers of the laminated circuit board according to the first embodiment.

The method of producing the laminated circuit board 1 is described below with reference to FIG. 2 according to the first embodiment. FIG. 2 is a schematic diagram that illustrates the method of stacking layers of the laminated circuit board 1 according to the first embodiment. During the process of producing the laminated circuit board, the boards 10A and 10B are laminated with bonding sheets or the bonding layer 20, first. At this process, a mylar film 21 is laid on a surface opposite to the surface that covers the board 10A or 10B.

After the bonding surfaces are laminated with the bonding resin by, for example, heat in such a manner that the joint lands 12 and the wiring patterns 11 of the boards 10A and 10B are covered, the through-hole 32 is formed on the mylar film 21 of each bonding sheet that covers the board 10A or 10B, penetrating the bonding layer at a position over the joint land 12. If a typical epoxy material is used, the laminating process needs the temperature from about 50° C. to about 100° C.

Moreover, to form the through-hole 32, the insulating resin is heated and sublimated by using a carbon dioxide laser. After the processing, melted resin (smear) is removed from the interface of the conductive land by using plasma treatment. The processed through-hole 32 is then filled with the conducting material 13. The through-hole 32 is filled with the conducting material 13 by printing using a stencil treatment or a tempest technology.

More particularly, as illustrated in FIG. 2, by movement of a squeegee 40, the conducting material is applied (printed) onto the board 10A and, thus, the through-hole 32 is filled with the conducting material 13 to connect the joint lands 12 ((1) of FIG. 2).

Thereafter, the plate 30 is arranged appropriately with respect to the joint lands 12, then the mylar film 21 is removed from the bonding layer 20, and then the position is decided between the plate 30 and the bonding surface of each of the boards 10A and 10B (see (2) of FIG. 2). Thereafter, the plate is inserted to between the stacked boards 10A and 10B and then heat and pressure are applied in vacuum, the pressure being in a direction perpendicular to the boards 10A and 10B. Thus, the laminated circuit board 1 is produced. Because the layer stacking is performed in vacuum, the boards 10A and 10B are bonded together without any void on the bonding layer 20 and the joint lands 12 are connected to each other.

With this lamination, as illustrated in FIG. 2, in the laminated circuit board 1, the bonding resin of the bonding layer 20 is moved by the layer-stacking pressure into the adjusting through-holes 31. Therefore, the layer-stacking-pressure-induced moving speed of the bonding resin of the bonding layer 20 is suppressed and the moved bonding resin is prevented from pushing the conducting material 13 away.

Effects of the First Embodiment

As described above, the laminated circuit board 1 includes the boards 10A and 10B each having the joint lands 12 on the surface thereof; the bonding layer that is made of the bonding resin, being laid between the board 10A and the board 10B and electrically contact the joint lands 12 to each other via the conducting material; and the plate 30 that has the through-hole 32 into which the conducting material 13 is supplied. Because the plate 30 has the adjusting through-holes 31 that function as spaces to accommodate the excess bonding resin that appear during layer stacking, it is possible to produce a laminated circuit board easily by preventing a conducting material from being pushed away by a bonding sheet moving with a layer-stacking pressure.

Moreover, because, in the first embodiment, the resin accommodating spaces are through-holes, it is possible to form the resin accommodating spaces on the stacked boards 10A and 10B, in accordance with the wires on the stacking surfaces, in one process, which simplifies the processing as compared with a case of processing the both surfaces separately.

[b] Second Embodiment

Although, in the first embodiment, the boards are laminated with the bonding layer and then the plate is inserted to between the boards, some other embodiments are allowable. It is allowable to first form the bonding layer on the plate, thereby obtaining a layer member, and then stack the layer member on the board.

Figure 3:
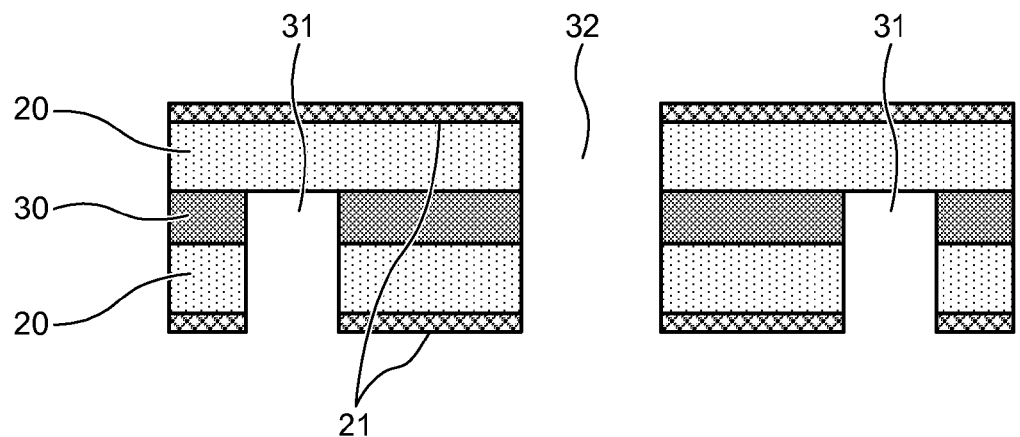
FIG. 3 is a schematic diagram of a layer member.
Figure 4:
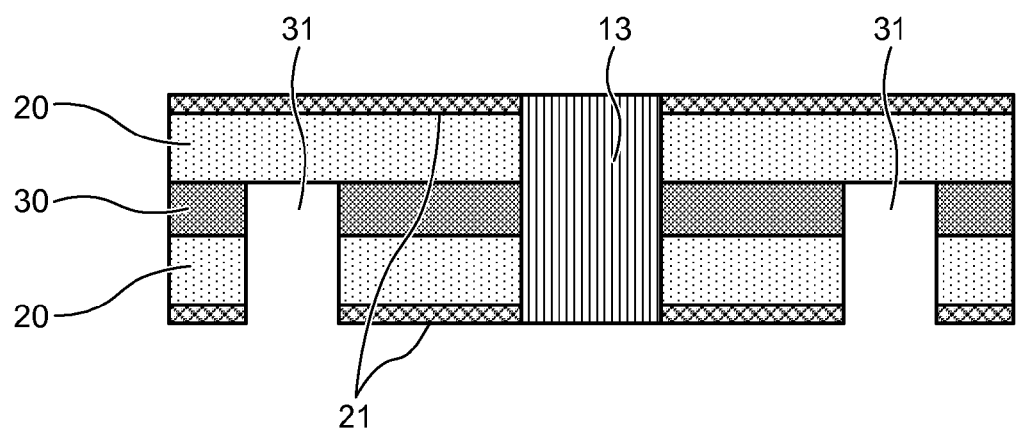
FIG. 4 is a schematic diagram of the layer member filled with a conducting material.
Figure 5:
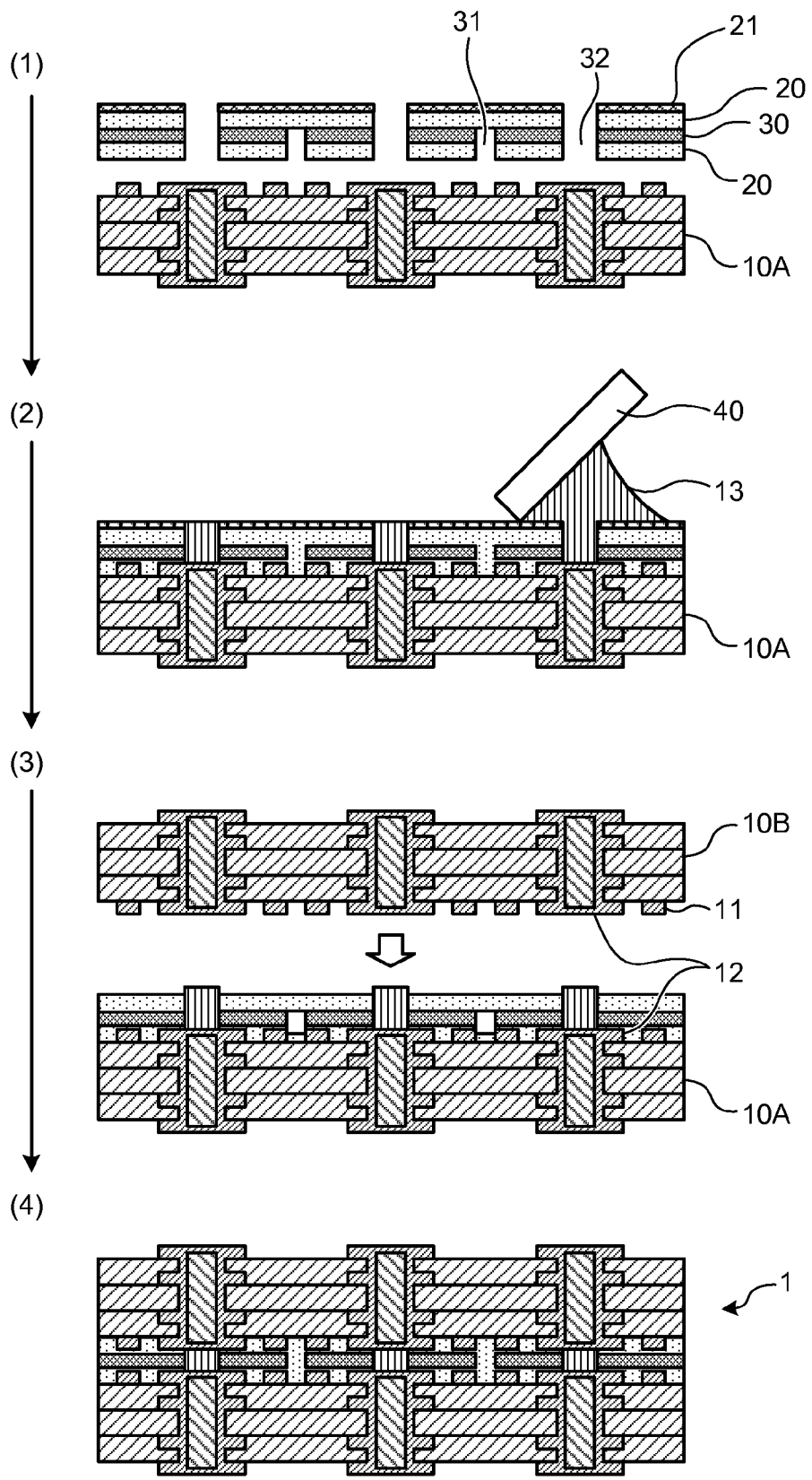
FIG. 5 is a schematic diagram that illustrates a method of producing a laminated circuit board according to the second embodiment.

In the following second embodiment, the board is laminated with a layer member that is produced by forming the bonding layer on the plate. The layer member of the laminated circuit board and the method of producing the layer member are described with reference to FIGS. 3 to 5 according to the second embodiment. FIG. 3 is a schematic diagram of the layer member. FIG. 4 is a schematic diagram of the layer member filled with the conducting material. FIG. 5 is a schematic diagram that illustrates the method of producing the laminated circuit board according to the second embodiment.

As illustrated in FIG. 3, the layer member is produced by stacking the mylar film 21, then the bonding layer 20, then the plate 30, then the bonding layer 20, and finally the mylar film 21. In the example illustrated in FIG. 3, the mylar film 21 of the layer member is printed by using stencil treatment and, therefore, one bonding layer 20 (in the example of FIG. 3, the upper bonding layer) does not have holes at positions corresponding to the adjusting through-holes 31 of the plate 30, while the other bonding layer 20 has. The reason for forming the holes on the other bonding layer 20 at positions corresponding to the adjusting through-holes 31 is to facilitate removal of air from the through-holes during the layer stacking. As illustrated in FIG. 4, in the layer member, the through-hole 32 is filled with the conducting material 13.

The method of producing the laminated circuit board is described below with reference to FIG. 5 according to the second embodiment. First, the stacked boards 10A and 10B are prepared and the layer member is produced by forming the bonding layers 20 on the plate 30. Then, the board 10A, which is a layer of the laminated circuit board, is laminated with the layer member (see (1) of FIG. 5).

Then, by movement of the squeegee 40, the conducting material is applied (printed) onto the board 10A and, thus, the through-hole 32 is filled with the conducting material 13 to connect the joint lands 12 (see (2) of FIG. 5). In the example of FIG. 5, the conducting material 13 is supplied to the board 10A, while no conducting material is supplied to the board 10B. Because an adequate volume of the conducting material is applied onto the board 10A, it is unnecessary to supply the conducting material to both boards.

After the two or more plates 30 are arranged in such a manner that the through-hole 32 of each plate are aligned with the corresponding joint lands 12, the mylar film 21 is removed from the bonding layer 20, and then the position is decided with respect to each of the bonding surfaces of the boards 10A and 10B (see (3) of FIG. 5). Thereafter, heat and pressure are applied in vacuum, the pressure being in a direction perpendicular to the two or more plates 30 and the two position-decided boards 10A and 10B (see (4) of FIG. 5).

As described above, in the laminated circuit board 1 according to the second embodiment, the bonding layers are formed in advance on the front surface and the rear surface of the plate 30, respectively. This simplifies the producing of the laminated circuit board 1.

Moreover, the bonding surfaces of the bonding layers 20 that are formed on the front surface and the rear surface of the plate 30, respectively are covered with the mylar films 21, i.e., the bonding surfaces of the bonding layers 20 are protected by the mylar films 21.

Moreover, one bonding layer that is formed on either the front surface or the rear surface of the plate has the through-holes to accommodate the excess bonding resin, while the other bonding layer does not, which simplifies production of the laminated circuit board 1.

Moreover, the through-hole of the plate is filled with the conducting material 13 in advance to connect the joint lands 12 to each other, which simplifies production of the laminated circuit board 1.

[c] Third Embodiment

The present invention is not limited to the first embodiment and the second embodiment and can be embodied variously. Other embodiments are described below as the third embodiment.

(1) Layer Member

Although, in the second embodiment, one bonding layer 20 of the layer member has holes at positions corresponding to the adjusting through-holes 31, while the other bonding layer 20 does not, the configuration is not limited thereto. It is allowable to form the adjusting through-holes 31 on the both bonding layers.

Figure 6:
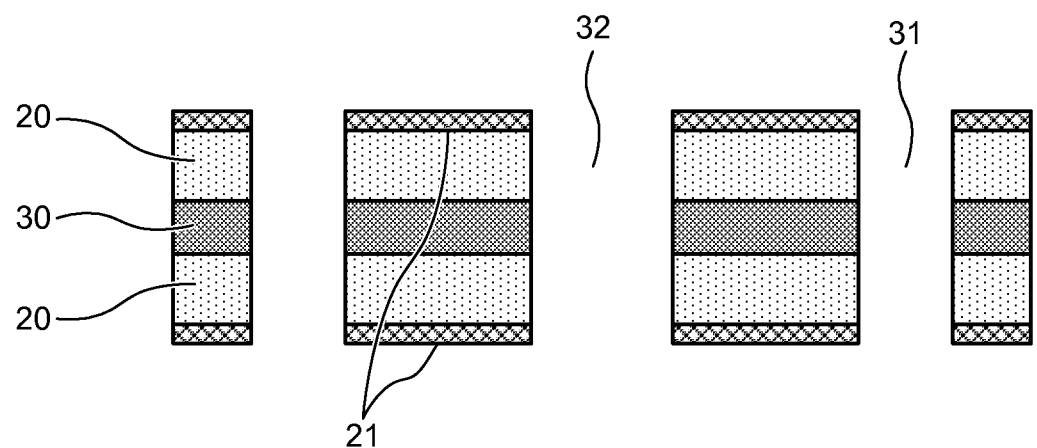
FIG. 6 is a schematic diagram of a layer member.

More particularly, the layer member illustrated in FIG. 6 is produced by stacking the mylar film 21, then the bonding layer 20, then the plate 30, then the bonding layer 20, and finally the mylar film 21 in the same manner as the layer member in the second embodiment. Each of the upper bonding layer 20 and the lower bonding layer has holes at positions corresponding to the adjusting through-holes 31 of the plate 30.

(2) Through-Hole

Moreover, any process can be used to form the adjusting through-holes 31 and the through-hole 32. It is allowable to separately process the bonding layer and the plate and then bond them together. Alternatively, it is allowable to bond the bonding layer and the plate and then process the same portions of the bonded layers. Moreover, any processing manner can be used and the bonding layer and the plate can be processed by using a typical drill or a typical laser.

(3) Applicable Devices

In order to achieve the object, the technology disclosed herein can be used in various devices, such as large scale integrations (LSIs), interposers, mother boards, various semiconductor devices, various package boards, various relay devices, various circuit boards.

According to an embodiment of the laminated circuit board disclosed in the subject application, it is possible to produce a laminated circuit board easily by preventing a conducting material from being pushed away by a bonding sheet moving with a layer-stacking pressure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A laminated circuit board comprising:
    a first wiring board that has a first land formed on a surface thereof;
    a second wiring board that has a second land formed on a surface thereof;
    a bonding layer that is made of a bonding resin, being laid between the first wiring board and the second wiring board, wherein the bonding layer electrically connects the first land and the second land via a conducting material; and
    a plate that has a through-hole into which the conducting material is supplied, wherein
    the plate has a resin accommodating space that accommodates therein an excess bonding resin that appears during layer stacking, the resin accommodating space having a total volume equal to a volume calculated using a residual copper ratios of wiring surfaces of the first and the second wiring boards.

2. The laminated circuit board according to claim 1, wherein the resin accommodating space is a through-hole.

3. The laminated circuit board according to claim 1, wherein the bonding layer is formed on each of the front surface and the rear surface of the plate in advance.

4. The laminated circuit board according to claim 2, wherein the bonding layer is formed on each of the front surface and the rear surface of the plate in advance.

5. The laminated circuit board according to claim 3, wherein a bonding surface of the bonding layer that is formed on each of the front surface and the rear surface of the plate is covered with a protective film.

6. The laminated circuit board according to claim 3, wherein a bonding layer that is formed on either the front surface or the rear surface of the plate has a through-hole that accommodates therein the excess bonding resin but the other bonding layer does not.

7. The laminated circuit board according to claim 4, wherein a bonding layer that is formed on either the front surface or the rear surface of the plate has a through-hole that accommodates therein the excess bonding resin but the other bonding layer does not.

8. The laminated circuit board according to claim 1, wherein the through-hole of the plate is filled with the conducting material in advance to connect the first land and the second land.

9. The laminated circuit board according to claim 2, wherein the through-hole of the plate is filled with the conducting material in advance to connect the first land and the second land.

10. The laminated circuit board according to claim 3, wherein the through-hole of the plate is filled with the conducting material in advance to connect the first land and the second land.

11. The laminated circuit board according to claim 4, wherein the through-hole of the plate is filled with the conducting material in advance to connect the first land and the second land.

12. The laminated circuit board according to claim 5, wherein the through-hole of the plate is filled with the conducting material in advance to connect the first land and the second land.

13. A method of producing a laminated circuit board, the method comprising:
    forming bonding layers on bonding surfaces of a first wiring board and a second wiring board, wherein the first wiring board has a first land formed on the surface thereof, the second wiring board has a second land formed on the surface thereof, and the bonding layers electrically connect the first land and the second land via a conducting material;
    forming a through-hole on the bonding layers to accommodate the conducting material;
    filling the through-hole with the conducting material;
    aligning a plate to a bonding plane where the first wiring board and the second wiring board are bonded together, wherein the plate has a resin accommodating space that accommodates therein an excess bonding resin that appears during layer stacking, the resin accommodating space having a total volume equal to a volume calculated using a residual copper ratios of wiring surfaces of the first and the second wiring boards; and
    applying heat under pressure to perform the layer stacking, wherein the pressure is in a direction perpendicular to the plate position-decided at the deciding and layers of the first wiring board and the second wiring board.

* * * * *